US009269527B2

(12) United States Patent
Reed et al.

(10) Patent No.: US 9,269,527 B2
(45) Date of Patent: Feb. 23, 2016

(54) HIGH-SPEED MULTI-FRAME DYNAMIC TRANSMISSION ELECTRON MICROSCOPE IMAGE ACQUISITION SYSTEM WITH ARBITRARY TIMING

(71) Applicant: Lawrence Livermore National Security, LLC, Livermore, CA (US)

(72) Inventors: Bryan W. Reed, Livermore, CA (US); William J. DeHope, Pleasanton, CA (US); Glenn Huete, Tracy, CA (US); Thomas B. LaGrange, Brentwood, CA (US); Richard M. Shuttlesworth, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/653,138

(22) PCT Filed: Feb. 14, 2014

(86) PCT No.: PCT/US2014/016566
§ 371 (c)(1),
(2) Date: Jun. 17, 2015

(87) PCT Pub. No.: WO2014/100835
PCT Pub. Date: Jun. 26, 2014

(65) Prior Publication Data
US 2015/0332888 A1    Nov. 19, 2015

Related U.S. Application Data

(60) Provisional application No. 61/738,353, filed on Dec. 17, 2012.

(51) Int. Cl.
*H01J 37/075* (2006.01)
*H01J 37/073* (2006.01)
(Continued)

(52) U.S. Cl.
CPC ............. *H01J 37/073* (2013.01); *H01J 37/10* (2013.01); *H01J 37/147* (2013.01); *H01J 37/21* (2013.01);
(Continued)

(58) Field of Classification Search
USPC ......................................................... 250/311
See application file for complete search history.

(56) References Cited

U.S. PATENT DOCUMENTS

| 7,557,977 B2 | 7/2009 | Oron et al. |
| 2006/0235693 A1 | 10/2006 | Ruderman et al. |

(Continued)

OTHER PUBLICATIONS

International Search Report and Written Opinion for PCT/US2014/016566, mailed May 29, 2014; ISA/KR.

(Continued)

*Primary Examiner* — Kiet T Nguyen
(74) *Attorney, Agent, or Firm* — Harness, Dickey & Pierce, PLC

(57) ABSTRACT

An electron microscope is disclosed which has a laser-driven photocathode and an arbitrary waveform generator (AWG) laser system ("laser"). The laser produces a train of temporally-shaped laser pulses each being of a programmable pulse duration, and directs the laser pulses to the laser-driven photocathode to produce a train of electron pulses. An image sensor is used along with a deflector subsystem. The deflector subsystem is arranged downstream of the target but upstream of the image sensor, and has a plurality of plates. A control system having a digital sequencer controls the laser and a plurality of switching components, synchronized with the laser, to independently control excitation of each one of the deflector plates. This allows each electron pulse to be directed to a different portion of the image sensor, as well as to enable programmable pulse durations and programmable inter-pulse spacings.

20 Claims, 6 Drawing Sheets

(51) Int. Cl.
  *H01J 37/21*  (2006.01)
  *H01J 37/10*  (2006.01)
  *H01J 37/147*  (2006.01)
(52) U.S. Cl.
  CPC .... *H01J 2237/06333* (2013.01); *H01J 2237/10* (2013.01); *H01J 2237/15* (2013.01); *H01J 2237/2802* (2013.01)

(56) References Cited

U.S. PATENT DOCUMENTS

| 2011/0168888 | A1 | 7/2011 | Reed et al. |
| 2011/0220791 | A1 | 9/2011 | Reed |
| 2015/0235800 | A1* | 8/2015 | Reed ................... H01J 37/075 250/307 |

OTHER PUBLICATIONS

Decision on Petition Under 37 C.F.R. 1.78(b) to Revive Unintentionally Abandonded Priority Claim for Non-Provisional Application issued May 16, 2014 for co-pending U.S. Appl. No. 14/181,321.
Reed, B. W. et al. "The Evolution of Ultrafast Electron Microscope Instrumentation," Microsc. Microanal, vol. 15, 2009, pp. 272-281.
Domer, H. et al. "High-Speed Transmission Electron Microscope," Review of Scientific Instruments, vol. 74, No. 10, Oct. 2003, pp. 4369-4372.
Niu, H. et al. "Picosecond Framing Technique Using A Conventional Streak Camera," AIP Review of Scientific Instruments, vol. 52, 1981, pp. 1190-1192.
Yang, J. et al. "Low-emittance Electron-Beam Generation With Laser Pulse Shaping In Photocathode Radio-Frequency Gun," AIP Journal of Applied Physics, vol. 92, 2002, pp. 1608-1612.
Bowers, Mark et al. "The Injection Laser System on the National Ignition Facility," SPIE Photonics West, Jan. 20, 2007-Jan. 25, 2007, 20 pages.
Park, Hyun Soon et al. "4D Ultrafast Electron Microscopy: Imaging Of Atomic Motions, Acoustic Resonances, And Moiré Fringe Dynamics," Ultramicroscopy, vol. 110, 2009, pp. 7-19.
Browning, Nigel D. et al. "Dynamic Transmission Electron Microscopy." Handbook of Nanoscopy (2012), 35 pages.
LaGrange, Thomas et al. "Approaches For Ultrafast Imaging Of Transient Materials Processes In The Transmission Electron Microscope," Micron, vol. 43, No. 11, Nov. 2012, pp. 1108-1120.
Kang, J. S. et al. "Development of a Dynamic Transmission Electron Microscope (DTEM) for the Study of Self-Propagating Reactions in Multilayer Foils," Microsc Microanal, vol. 11 (Suppl 2), 2005, pp. 484-485.
LaGrange, Thomas et al. "Nanosecond Time-Resolved Investigations Using the In Situ of Dynamic Transmission Electron Microscope (DTEM)," Ultramicroscopy, vol. 108, No. 11, Oct. 2008, pp. 1441-1449.
LaGrange, Thomas et al. "Single-Shot Dynamic Transmission Electron Microscopy,"Applied Physics Letters, vol. 89, 2006, pp. 044105-1-044105-3.
LaGrange, Thomas et al. "The Development of a Flexible Laser Platform for Photoemission Based, High-Time Resolution Electron Microscopes," Microsc. Microanal., vol. 18 (Suppl 2), 2012, pp. 594-595.
"AWG Converts Light To Rapid-Fire Pulses," Laser Focus World, vol. 37, No. 7, Jul. 1, 2001, 9 pages.
"Dynamic Imaging with Electron Microscopy," Science & Technology Review, Sep. 2013, 27 pages.
Takaoka, Akio and Ura, Katsumi. "Stroboscopic TEM with Time Resolution of 30 us," J. Electron Microsc., vol. 32, No. 4, 1983, pp. 299-304.
LaGrange, Thomas T. et al. "Movie Mode Dynamic Transmission Electron Microscopy (DTEM): Multiple Frame Movies of Transient States in Materials with Nanosecond Time Resolution," Microscopy and Microanalysis, Nashville, TN, Aug. 7, 2011-Aug. 11, 2011, 3 pages.
Tarri, Kimmo et al. "Partial Nephrectomy With A Combined CO2 and Nd:YAG Laser: Experimental Study in Pigs," Lasers in Surgery and Medicine, vol. 14, 1994, pp. 23-26.
Toytman, I. et al. "Multifocal Laser Surgery: Cutting Enhancement by Hydrodynamic Interactions Between Cavitation Bubbles," Physical Review E, vol. 82, No. 046313, 2010, 11 pages.
Takasago, Kazuya et al. "Generation of Amplified Picosecond Square Pulses for Low Emittance Electron Generation in Photocathode RF-GUN," http://web.archive.org/web/20040301000000*/http://www.stonybrook.edu/icfa2001/Papers/w3-1.pdf; believed to be at least Mar. 4, 2004, 11 pages.

* cited by examiner

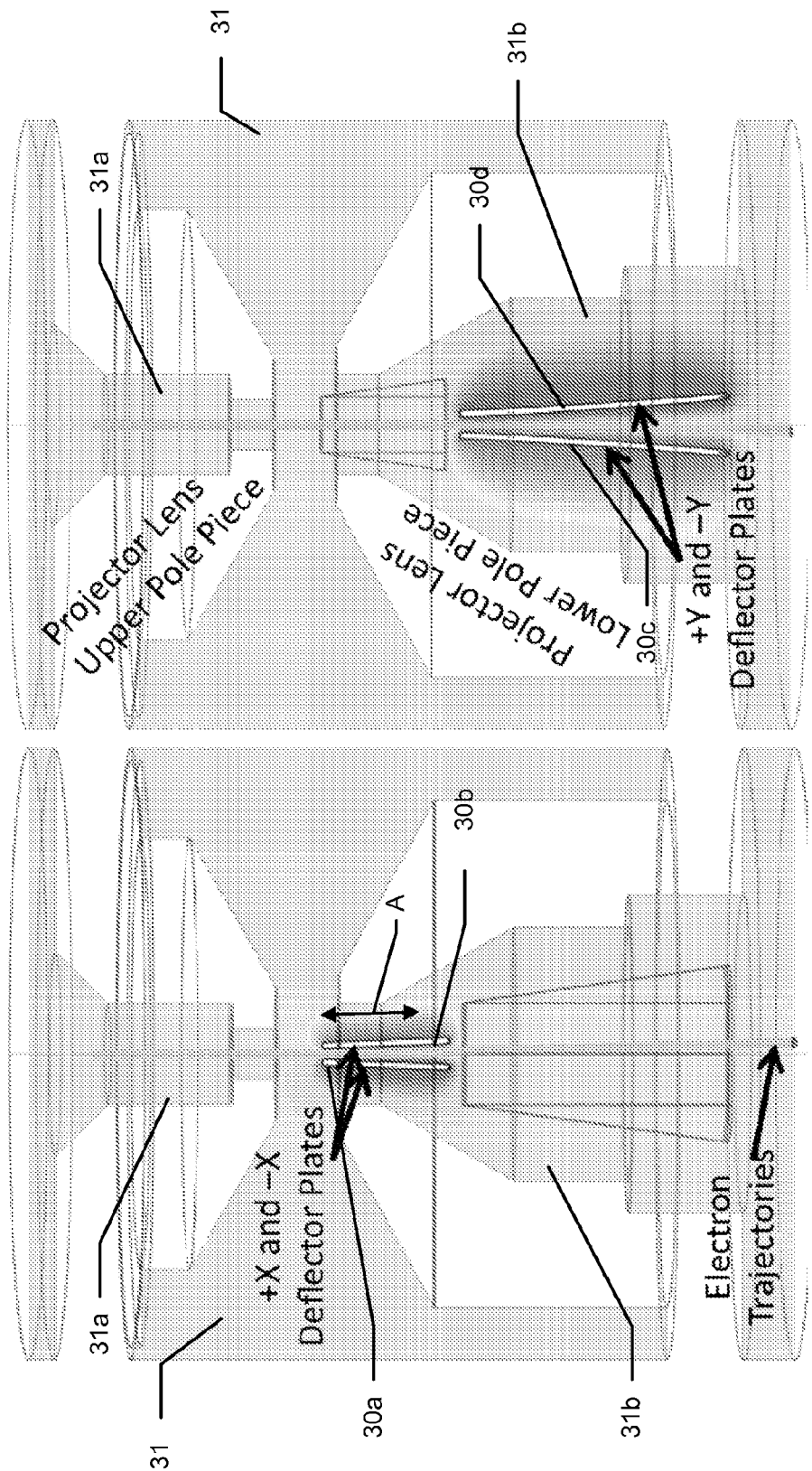

HIGH-SPEED MULTI-FRAME DYNAMIC TRANSMISSION ELECTRON MICROSCOPE IMAGE ACQUISITION SYSTEM WITH ARBITRARY TIMING

CROSS-REFERENCE TO RELATED APPLICATIONS

This application claims priority from U.S. provisional application Ser. No. 61/738,353, filed on Dec. 17, 2012, entitled HIGH-SPEED MULTIFRAME TRANSMISSION ELECTRON MICROSCOPE IMAGE ACQUISITION SYSTEM WITH ARBITRARY TIMING, which is incorporated by reference herein.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to electron microscopes, and in particular, to a high-speed multi-frame dynamic transmission electron microscope image acquisition system with arbitrary timing.

BACKGROUND

Small objects tend to evolve over short timescales. For example, in chemistry, biology, and materials science, a sequence of changes no more than a nanometer in size can pass by in a microsecond, leaving behind little evidence. Reconstructing these processes and determining how and why they took place can be a difficult task. Many techniques can record the static, before and after states of materials, some even at high spatial resolutions, but they often lack the temporal resolution to capture the nearly instantaneous changes occurring over time intervals shorter than 0.1 ms.

For example, conventional transmission electron microscopy/microscopes (TEM) is a well-established technique/instrument using electrons instead of light for investigating material properties and structure at size scales from micrometers to angstroms at the atomic level. TEMs operate on the same principles as a light microscope but substitute electrons for light to achieve much higher spatial resolution. Electron microscopes typically generate electrons through thermionic emission, in much the same way an incandescent bulb uses heat to produce light, or through field emission, which combines a metallic conductor and an electrostatic field. Electrons emitted by a source, usually at the top of the microscope, are typically focused by magnetic lenses into a narrow beam and directed through a thin specimen. Depending on the specimen's material properties, for example its density and crystalline structure, some of the electrons are scattered and used to form an image or diffraction pattern. Subsequent lenses in the TEM column magnify this image or pattern onto a fluorescent screen. The resulting light and dark regions provide information about the materials examined, including their crystalline grain structure, defects, or even single atomic rows and columns. A camera at the bottom of the microscope then records the data. Conventional TEMs produce a steady stream of electrons that pass through the optical column one at a time, and achieve the desired beam parameters using small apertures with lenses to discard all but a fraction of the current.

Despite the relatively high spatial resolutions (i.e. spatial resolutions higher than light microscopes) achievable by conventional TEM microscopes, their relatively low temporal resolutions (e.g. second- or millisecond-scale) are often inadequate to capture the fast dynamic processes in materials, e.g. microstructured or nanostructured materials, which occur at such small size scales. In particular, conventional TEM measurements are made at roughly standard video frame rates (e.g. ~24 frames per second), which are governed by the electron source current and brightness and the capabilities of the image acquisition systems, and which are often thousands or even millions of times slower than the rate at which processes typically evolve in microstructured or nanostructured materials. Such material processes also are often unique, never unfolding exactly the same way twice, necessitating single-shot high-speed acquisition for their study. Examples include mechanical deformation and the interaction between phase transformations and microstructure. To capture dynamic behavior with a conventional TEM microscope, researchers must start and stop a process, which is not always feasible and rarely precise.

Dynamic transmission electron microscopy (DTEM) is another methodology similar to and modified from conventional TEM technology for investigating material properties and structure. A microscope making use of DTEM technology, however, can capture transient processes/events in materials with enhanced (e.g. nanosecond-scale) time resolution as a high quality image or diffraction pattern of the state of a material at some known time interval after an event has begun. In contrast to conventional TEM instruments, which produce a steady stream of electrons (such as produced by thermionic emission) that pass through the optical column one at a time, a DTEM instrument releases electrons in a single burst as an extremely brief (e.g. 1 ns to few μs timescales) bright electron pulse operating at high electron current, producing billions of electrons in a pulse. The high current is typically achieved through photoemission, driven by a pulsed laser (e.g. ultraviolet laser) directed upon a metal cathode, such as for example a tantalum disk. In particular, the laser is arranged to direct a pulse of light into the optical column of the TEM where it may be reflected by a mirror onto the cathode to release a burst of electrons. The electron pulse emitted from the electron source is then accelerated through a system of condenser lenses that focus and point the beam upon the investigated sample. It is notable that while conventional TEMs achieve the desired beam parameters using small apertures to discard all but a fraction of the current, the lens system of a DTEM microscope is typically designed with additional condenser lenses and an extra focusing (crossover) region, and also with a reduced number of apertures, to maximize electron throughput while focusing the beam down to a small spot on the sample to boost spatial resolution. Furthermore, the duration of the laser pulse determines the "exposure time" for recording the image or diffraction pattern.

In this manner, a DTEM microscope controls the electron emission such that it is correlated in time with the transient process being studied, which is typically triggered or initiated by a pulsed laser striking the material, though other methods are possible. As a result, a DTEM microscope produces a brighter, higher current beam than a conventional TEM with little sacrifice in beam coherence (which affects image contrast and diffraction-pattern sharpness). In addition, researchers can adjust the lens's focal length to control how much of the beam is used in an experiment. Because a DTEM microscope acquires sufficient information in a single experiment to generate a high-resolution image of a micro- to nanosecond-long, nanoscale event, irreversible events such as phase transformations, chemical reactions and crystal growth can be studied.

Unfortunately, standard DTEM microscopes are configured for single shot operation to only capture a single image or diffraction pattern per sample drive event/camera read-out time, which is typically on the scale of milliseconds to seconds. Thus many of the details of complex, unique processes may still be lost. Single-shot DTEM experiments are typically repeated on unprocessed specimens or regions of the specimen as often as required, each with a different time delay, and the collection of images are combined into an averaged view of the process over time. While an averaged view is sufficient for studying reactions that are nearly identical every time, and while a high time-resolution single image provides some research value, they lack the ability to scrutinize more complex or variable behavior and fast material processes ranging from phase transformations to chemical reactions and nanostructure growth.

SUMMARY

In one aspect the present disclosure relates to an electron microscope. The electron microscope may comprise a laser-driven photocathode and an arbitrary waveform generation (AWG) laser system. The AWG laser system may be used for producing a train of temporally-shaped laser pulses of programmable pulse durations, and arranged to direct the laser pulses to the laser-driven photocathode for producing a train of electron pulses. A first lens stack may be arranged to focus the train of electron pulses to a sample. A second lens stack may produce a magnified image or diffraction pattern of the sample onto an image sensor. A deflector subsystem may have a plurality of electrostatic deflector plates arranged downstream of the sample and upstream of the image sensor. The deflector plates may be arranged offset from, and circumscribing, an axis along which the train of electron pulses travel. A control system may be included which has a digital sequencing component in communication with both the AWG laser system and the deflector subsystem. The control system may communicate with a plurality of switching components and be synchronized with the AWG laser system for rapidly and reversibly switching voltage signals applied to each one of the deflector plates to independently control excitation of each one of the deflector plates. This synchronizes operation of the deflector subsystem with the train of laser pulses to direct each electron pulse to a different portion of the image sensor, to thus capture a high-speed sequence of images or diffraction patterns of the sample. The control system provides each electron pulse with an independently set and programmable pulse duration, and provides inter-pulse spacings between sequentially generated ones of the electron pulses that are independently controlled and programmable.

In another aspect the present disclosure relates to an electron microscope that includes a laser-driven photocathode and an arbitrary waveform generation (AWG) laser system. The AWG laser system produces a train of temporally-shaped laser pulses. Each laser pulse has a programmable pulse duration and is separated by programmable inter-pulse spacings. The AWG laser system directs the laser pulses to the laser-driven photocathode for producing a train of electron pulses. A first lens stack is arranged to focus the train of electron pulses to a sample. A second lens stack produces a magnified image or diffraction pattern of the sample on an image sensor. A control system provides control inputs to the AWG laser system for controlling the programmable pulse durations and programmable inter-pulse spacings between the train of temporally-shaped laser pulses. A deflector subsystem is controlled by the control system and includes a plurality of spaced apart electrostatic deflector plates arranged downstream of the sample and upstream of the image sensor. A voltage supply system supplies high voltage signals to the deflector plates and is controlled by the control system and synchronized with the AWG laser system. A plurality of switching elements controlled by the control system generates switching signals to independently control an application of the high voltage signals to each one of the deflector plates. The control system includes a digital sequencing component configured to independently and rapidly reversibly switch the high voltage signals applied to each of the deflector plates in synchronization with the train of laser pulses. This causes each electron pulse to be directed to a different portion of the image sensor to capture a high-speed sequence of images or diffraction patterns of the sample.

In still another aspect the present disclosure relates to a method for performing dynamic transmission electron microscopy (DTEM). The method may comprise using a laser-driven photocathode and an arbitrary waveform generation (AWG) laser system. The AWG laser system may generate a train of temporally-shaped laser pulses of programmable pulse durations and programmable inter-pulse spacings. The temporally-shaped laser pulses may be directed at the laser-driven photocathode to impinge the laser-driven photocathode and cause a train of electron pulses to be emitted from the laser-driven photocathode. The train of electron pulses may then be focused to a sample. An image sensor may be used to receive the train of electron pulses downstream of the sample after the train of electron pulses has impinged the sample. A deflector subsystem may have a plurality of deflector plates arranged downstream of the target but upstream of the image sensor, to controllably deflect the train of electron pulses onto selected subportions of the image sensor. A control system may be used which has a digital sequencer. The control system may communicate with the AWG laser system, the deflector subsystem and a plurality of switching components to synchronize the AWG laser system and the deflector subsystem to rapidly and reversibly switch voltage signals applied to each one of the deflector plates. This enables independent excitation of each one of the deflector plates and synchronizes operation of the deflector subsystem with the train of laser pulses. The deflector subsystem helps to direct each electron pulse to a different portion of the image sensor. In this manner the image sensor may capture a high-speed sequence of images or diffraction patterns of the sample. The control system further provides each electron pulse with an independently set and programmable pulse duration, and enables the inter-pulse spacings between sequentially generated ones of the electron pulses to be programmable.

In other various implementations the present disclosure provides an electron microscope comprising a laser-driven photocathode; an arbitrary waveform generation (AWG) laser system for producing a train of temporally-shaped laser pulses of a programmable pulse durations, and arranged to direct the laser pulses to the laser-driven photocathode for producing a train of electron pulses; a first lens stack arranged to focus the train of electron pulses to a sample; a second lens stack for producing a magnified image or diffraction pattern of the sample on an image sensor; and a deflector having electrostatic deflector plates arranged downstream of the sample and upstream of the image sensor, and synchronized with the laser system to rapidly and reversibly switch the deflector plate voltages in sync with the train of laser pulses so as to direct each electron pulse to a different portion of the image sensor to capture a high-speed sequence of images or diffraction patterns of the sample.

In another example implementation an electron microscope is provided comprising a laser-driven photocathode; an arbitrary waveform generation (AWG) laser system for producing a train of temporally-shaped laser pulses of a programmable pulse duration and waveform, and arranged to direct the laser pulses to the laser-driven photocathode for producing a train of electron pulses; a lens stack arranged to focus the train of electron pulses to a sample; a second lens stack producing a magnified image or diffraction pattern of the sample; an image sensor; a deflector having electrostatic deflector plates arranged downstream of the sample upstream of the image sensor; a controller connected to the deflector and synchronized with the laser system for rapidly and reversibly switching the deflector plate voltages in sync with the train of laser pulses, so as to direct each electron pulse to a different portion of the image sensor to capture a high-speed sequence of images or diffraction patterns of the sample.

In its various implementations, the present invention is generally directed to a high-speed multi-frame dynamic transmission electron microscope image acquisition system with arbitrary timing that is capable of acquiring multiple images or diffraction patterns on the nanosecond to microsecond scale before, during, and after a single sample drive event. As such the present invention may be characterized as a "movie-mode" DTEM that is capable of investigating fast, complex or variable material processes, events, or behavior, such as for example a branching growth front, phase transformation initiated from many sites, chemical reactions, and nanostructure growth. The various embodiments may make use of an arbitrary-waveform generation laser to drive the photocathode in a TEM. The Gaussian pulses obtained in a conventional pulsed laser do not produce as bright of an electron pulse as those produced by the laser system of the present disclosure. The various implementations described herein enable completely programmable and arbitrarily sequenceable pulse trains to be produced. All previous similar systems were limited to a single pulse length and a single interframe time (or, at most, variable only over a very small range) in an acquisition sequence. The various implementations described herein can produce any sequence one would want, including mixing multiple-microsecond-exposure images (which will have higher spatial resolution) and nanosecond-exposure images (which are needed to capture things moving extremely fast) completely arbitrarily, with virtually any sequence of movie-mode deflector settings one can imagine.

The various implementations include a deflector subsystem that can be inserted and removed while maintaining its alignment. The deflector subsystem is designed to produce sufficient deflection to span the entire width of the camera with relatively low voltages (less than about 1000 volts) so as to improve the high-speed electronic switching performance while providing less than about one pixel of average image distortion at the camera. The DTEM produced by the various implementations described herein has numerous advantages over single-shot DTEM. With movie-mode DTEM, researchers can watch the formation, movement, growth, and interaction of individual crystal grains, defects, phase fronts, and chemical reactions. They can also gather more data in fewer experiments, which is especially helpful when specimens are difficult to obtain or time consuming to prepare. In materials science, reactions often happen quickly and then slow down.

The movie-mode operation of the present invention may be used to tailor the image spacing and exposure time to focus on the important events. In addition, by using movie-mode, a high-resolution image of the 'before' state, i.e. what the sample is like immediately before the laser drive hits it, may be acquired before the material process/event is triggered or initiated.

DTEM may be used for exploring irreversible nanoscale material processes and providing insights into controlling these processes and material properties. The range of potential applications is just starting to emerge as the technology becomes more widely adapted. For instance, DTEM is a promising tool for biological research. Standard TEMs image biological samples in a fixed or frozen state, and although a light microscope can view life processes, it has only one-tenth of DTEM's spatial resolution. DTEM should be able to capture high-resolution images of biological events in liquid water such as protein binding and host-pathogen interactions. The present invention can also explore material behavior in atmospheric environments, as opposed to under vacuum.

The present invention integrates an arbitrary-waveform generation laser system with a high-speed deflector system arranged for synchronous operation with the laser system and capable of bidirectional, two-dimensional image shifting on the nanosecond scale. This enables a relatively large number (e.g. 9, 16, or 25) of frames with completely arbitrary choice of exposure times and interframe delay times for every single frame. This also enables experimental flexibility needed for high-time-resolution in situ transmission electron microscopy. In particular, the present invention enables multiple acquisitions with complete flexibility over exposure times and interframe times on the nanosecond to multiple-microsecond time scale.

The arbitrary temporal and spatial profile producible by the arbitrary-waveform laser generation system of the present invention can be tuned to produce the best possible effective electron source brightness, which can enhance DTEM performance in movie-mode and even in single-shot operation.

The system of the present invention, in one non-limiting example, may be configured for 9-frame acquisition with 15-ns exposure times and variable (~200 ns) interframe times. All of these parameters can be easily varied. Exposure times from ~5 ns to multiple µs (possible with the current hardware), interframe times as low as 5 ns (with minor modification of the electronics) and frame counts of 16 or 25 (with expansion of existing electronics) are all possible, as is streak imaging or streak diffraction in which the timing is adjusted so that the frame shifts are programmed to occur during the pulsed exposure.

The system of the present invention can be programmed for arbitrary sequences switching among 9 or 16 (with existing hardware) or 25 (with a simple upgrade) frames with complete control over the timing of the laser and frame shifting, even going back to earlier positions if desired (which was impossible with previous DTEM systems).

The integration of an arbitrary-waveform laser generation system with a DTEM has several advantages. Besides the ability to easily change exposure times for different experiments, it has been observed that there is a substantial increase in brightness of the electron pulse owing to the exceptional spatial quality and (possibly even more important) flat temporal profile of the laser beam. This improvement, which translates into improvements in signal-to-noise ratio, spatial coherence, and resolution, is believed to arise from space-charge effects in the electron gun.

Generally, the arbitrary-waveform generation laser on the DTEM operates to segment and amplify a seed laser with acousto-optical modulators and fiber amplifiers, modulate it with electro-optic modulators, and send the result into solid-state laser amplifiers for higher power. The DTEM system, for example, only has one arbitrary-waveform laser output and is required to produce arbitrary waveforms multiple microseconds in duration.

The movie-mode DTEM of the present invention enables unique, complex events to be watched in complete detail, from start to finish, in materials driven to extreme conditions (e.g. high temperatures or temperature gradients, high stresses, or nonequilibrium states produced by direct impingement of intense lasers). Without such a multi-frame modification, a DTEM can only capture one snapshot from each sequence of events, while the modification allows each individual event to be captured in detail. Thus the modification dramatically expands the relevant experimental range of DTEM in the area of materials dynamics under extreme conditions. It also improves the signal levels, spatial coherence, resolution, and reciprocal space resolution of a DTEM.

Relative to all similar systems such as single-shot DTEM, the movie-mode DTEM provides greater experimental flexibility by enabling researchers to tailor temporal-spatial resolution to fit the experimental needs. Material processing for electronic and optoelectronic devices, dynamics of nano-structured materials including catalysts and reactive nano-laminates, and (potentially) biological or biological-like analogue processes have all been investigated for study in single-shot DTEM, with significant basic research gains already demonstrated in several of these areas. Put differently, the MM DTEM improved the spatial resolution to the already improved temporal resolution of single shot DTEM.

Movie-mode DTEM (MM-DTEM) can record nine or more complete images or diffraction patterns in a temporal window from 0.5 to 150 microseconds, with variable delay between the frames, enabling the in-depth study of an individual, irreversible process. Even for highly repeatable reactions, movie mode can help researchers determine the full event sequence and the rate at which changes occur.

In movie mode, after a laser pulse initiates the material process, a series of laser pulses hits the cathode and generates an electron pulse train. The train passes through the sample, and a deflector, synchronized with the laser system, diverts each pulse onto a different region of a camera that is sensitive enough to image individual electrons. The camera stores the data in on-chip buffers that are read out after the experiment and segmented into frames. To make movie mode possible, the researchers upgraded the laser hardware and software and added the deflector to direct images onto the camera.

Further areas of applicability will become apparent from the description provided herein. It should be understood that the description and specific examples are intended for purposes of illustration only and are not intended to limit the scope of the present disclosure.

DRAWING DESCRIPTIONS

The drawings described herein are for illustration purposes only and are not intended to limit the scope of the present disclosure in any way. In the drawings:

FIG. 2 is highly simplified side view diagram of one pair of deflector plates that make up the deflector subsystem of the present system;

FIG. 3 is a highly simplified side view diagram of a second pair of deflector plates that make up the deflector subsystem;

Figure 5:
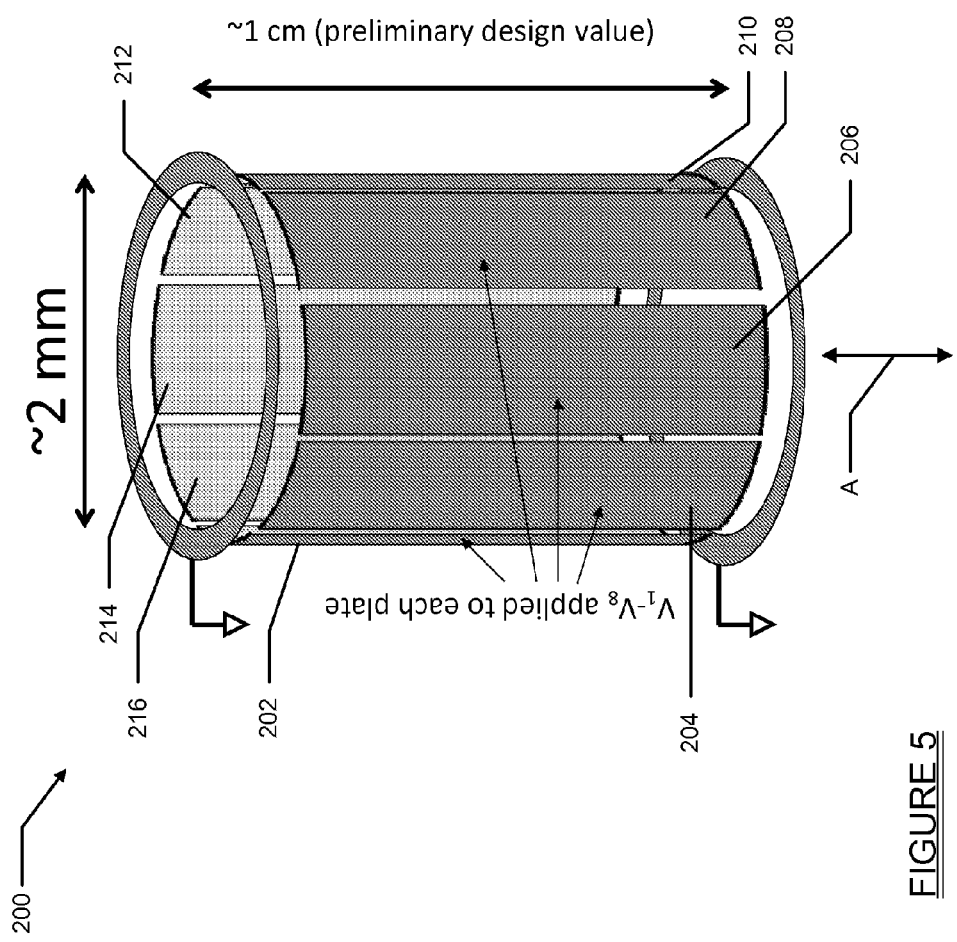
Figure 6:
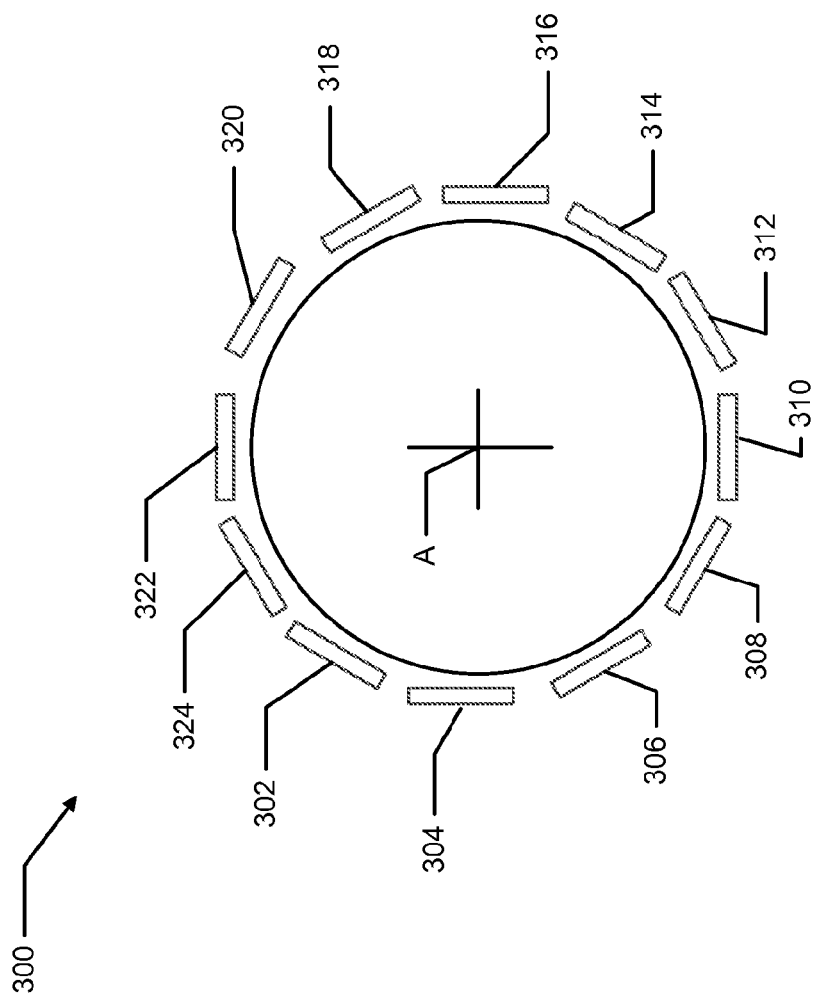

FIG. 5 is a high level perspective illustration of another example of an arrangement of deflector plates for the deflector subsystem, this example having eight deflector plates arranged generally circumferentially about an axial center of an arrangement; and FIG. 6 shows another example of the deflector subsystem in which 12 independent deflector plates are arranged in polar fashion about the axial center of the projector lens.

DETAILED DESCRIPTION

Figure 1:
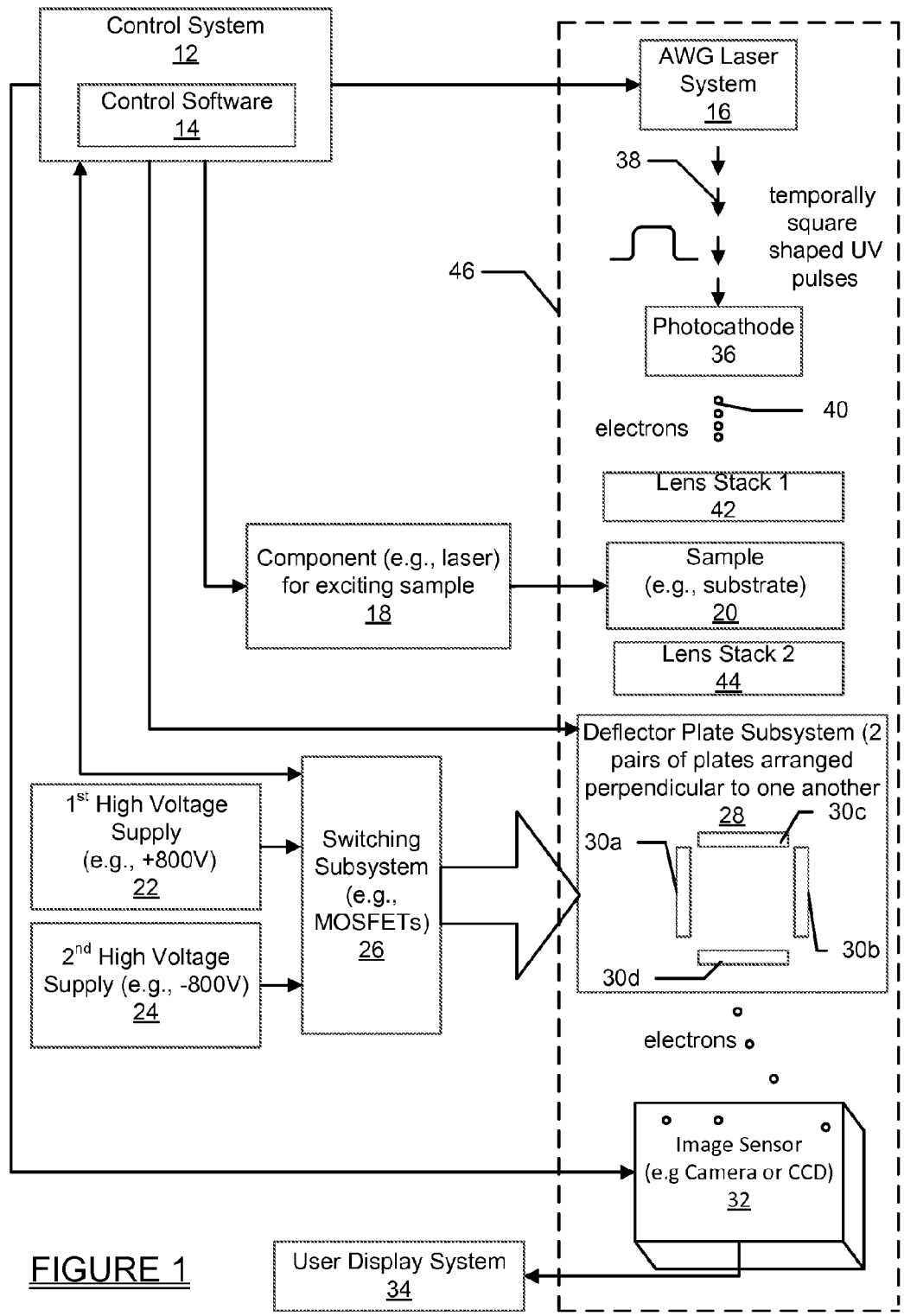
FIG. 1 is a high level block diagram of one example of an implementation of the subject matter of the present disclosure.

Turning now to the drawings, FIG. 1 shows a first embodiment of the high speed multi-frame DTEM image acquisition system 10 (hereinafter simply "system 10") in accordance with one example embodiment of the present disclosure. In this example the system 10 may comprise a control system 12 having suitable control software 14. The control system 12 and the control software 14 control an arbitrary waveform generation ("AWG") laser system 16, as well as an instrument 18, for example a laser, for exciting a sample 20 (e.g., substrate or "target"). The control system 12 and the control software 14 further control the application of deflector voltage signals ranging between +1600V and −1600V from high voltage +800V and −800V supplies 22 and 24, respectively, by controlling a switching subsystem 26. The switching subsystem 26 may comprise a plurality of switching elements, for example MOSFET semiconductor switches. Depending on the polarity of the MOSFET switches and the desirability of independently controlling all of the deflector voltages balanced against the cost and complexity of the system, it is possible to drive the system with a single high-voltage supply or with as many as four independent high-voltage supplies (one for each deflector plate).

The system 10 further includes a deflector subsystem 28 having a plurality of electrostatic deflector plates which may be independently energized by the control system 12 selectively controlling the switching subsystem 26. In one non-limiting example, the deflector subsystem 28 includes two pairs of deflector plates 30$a$/30$b$ and 30$c$/30$d$. The first pair of deflector plates 30$a$/30$b$ are arranged in this example parallel to one another and spaced apart from one another. The second pair of deflector plates 30$c$/30$d$ are arranged parallel to one another but perpendicular to the first pair of deflector plates 30$a$/30$b$. Since each plate 30$a$-30$d$ can be independently energized, this provides a total of 16 deflector-plate states if the system uses four MOSFET switches.

The control system 12 also controls a camera or image sensor, in this example a charge coupled device 32 ("CCD"). An output of the CCD 32 may be in communication with a user display system 34.

The system 10 may further include a photocathode 36 arranged downstream of the AWG laser system 16 to receive optical pulses 38 from the system 16. When the optical pulses 38 impinge the photocathode 36 they cause electrons 40 to be discharged from the photocathode. The electrons 40 in this example are directed through a first focusing lens stack 42 before they impinge and pass through the sample 20, after which they pass through a second lens stack 44 before they impinge the sample 20. The electrons 40 thereafter are controllably deflected by the electric fields created by the pairs of deflector plates 30$a$/30$b$ and 30$c$/30$d$, as controlled by the control system 12, so that they impinge on specific regions of the CCD 32. The information collected by the CCD 32 may then be displayed on a suitable user display system 34 for viewing and study by the user. In FIG. 1, the AWG laser system 16, the photocathode 36, the first and second lens stacks 42 and 44, the deflector plate subsystem 28 and the CCD 32 may form a DTEM microscope 46.

Arbitrary Waveform Generator (AWG) Laser System 16

The AWG laser system 16, operating in connection with the control system 12, is an important component of the system 10. The AWG laser system 16, operating in connection with the control system 12, overcomes the nonlinearities associated with frequency conversion and produces a train of temporally "square" ultraviolet (UV) laser pulses. This is in part accomplished through the programming (i.e., control software 14) of the control system 12 used with the AWG laser system 16. Specifically, sequencing is implemented by the control software 14 in long duration UV optical pulses which are temporally segmented. For example, a 500 ns pulse requires a large number of adjustable parameters to provide a temporally flat pulse at the photocathode 36. Without this capability, the performance of the photocathode 36 is dramatically degraded. The AWG laser system 16 of the present invention can produce square UV pulses (pulses 38 in FIG. 1) to produce brighter electron pulses over an unprecedented range of pulse durations timed precisely on a nanosecond level with the electron deflector plate subsystem 28, to produce multi-frame movies on nanosecond timescales.

The AWG laser system 16 combines a high-speed (1.25 GHz sample rate for this implementation), digital-to-analog arbitrary signal generator, a continuous-wave (CW) seed laser, and a series of laser amplifiers (both fiber-based and free space solid-state) and electro-optic and acousto-optic modulators (AOMs and EOMs). It also includes a refractive optic and a series of lens relays and pinhole spatial filters (not shown) designed to produce an extraordinarily flat spatial profile with a distinct lack of what are commonly called "hot spots." This flat spatial profile is extremely important for the efficient conversion of infrared photons first to ultraviolet photons and then to high-brightness photoemitted electrons. The system 10 is capable of modulating and amplifying a seed laser of the AWG laser system 16 to produce an arbitrarily-shaped series of the optical pulses 38 over an interval up to hundreds of microseconds in length, with a total energy per pulse series in the 100 millijoule to joule range. In particular, the AWG laser system 16 can generate laser pulses with durations estimated to range from a few nanoseconds to 250 microseconds, with inter-pulse delays similarly estimated to range from a few nanoseconds (estimated 5 ns) to many microseconds, with totally flexible control over the durations, intensities and delays of each pulse 38. When used to drive the photocathode 36, the AWG laser system 16 then causes the photocathode to produce a similar arbitrarily definable series of the electron pulses 40 inside the DTEM 46, with each pulse 40 containing enough electrons (typically ~$10^7$ to $10^9$) to produce a high-quality image or diffraction pattern. Laser driven photoemission is the only currently available means by which a sufficient number of electrons can be produced in such a short pulse. The AWG laser system 16 used in the system 10 has the high energy and excellent beam quality ($M^2<1.2$) needed to produce bright, coherent electron pulses.

Perhaps even more importantly, the pulse waveform from the AWG laser system 16 can be tuned to be nearly perfectly flat as a function of time. This has a substantial effect on the effective brightness of the electron pulses 40 emitted from the photocathode 36. Because of space charge effects, the apparent cathode position (i.e. the position from which the electrons 40 appear to be emerging, when back-projected from far-field asymptotes) is a function of the photoemitted current. A typical pulsed laser has a temporal profile approximating a Gaussian bell-shaped curve. If such a pulse is used for a photoemission source, then the current will follow another bell-shaped curve (modulated by space-charge nonlinearities) and thus the apparent cathode position will vary with time during the pulse. This variation happens far too quickly for a standard lens system to compensate, and even a sufficiently fast electrostatic lens system would be very difficult to tune for this purpose. As a result, the electron beam can only be in focus for a fraction of the pulse duration. Said another way, the apparent source position must be integrated over the duration of the pulse to yield the effective apparent source size, which will then be much larger than the real physical source size at any given time. The net result is a beam with degraded brightness. The temporally flat pulses 40 produced by the AWG laser system 16 do not suffer from this problem. As a result, the effective brightness of the DTEM's 46 photoemission source is substantially higher with the AWG laser system 16 than it would be with a conventional pulsed laser. Still another significant benefit of the temporally square pulses 38 is that they help to produce more electrons when striking the photocathode 36. This is because the instantaneous electron flux is constant throughout the duration of each pulse 40.

The system 10 of the present invention is completely programmable and arbitrarily sequenceable. Previous similar systems were limited to a single pulse length and a single interframe time (or, at most, variable only over a very small range) in an acquisition sequence. The system 10 of the present invention can produce virtually any pulse sequence one desires, mixing multiple-microsecond-exposure images (which will have higher spatial resolution) and nanosecond-exposure images (which are needed to capture things moving extremely fast) completely arbitrarily, with virtually any sequence of movie-mode deflector settings from the deflector subsystem 28 that one would need.

The DTEM's 46 AWG laser system 16 has been designed to be more programmable, flexible and durable for achieving the smooth beam profile required to generate a desirable electron pulse. This is expected to enable researchers to define an experiment's timescale and tailor the laser parameters accordingly. The AWG's laser system's 16 optical modulator and the electro-optical modulators help to control the laser pulse spacing, shape, and other details, enabling unprecedented temporal ranges. For example, and without limitation, the laser pulses 38 that create the electron pulses 40 can last from 10 nanoseconds to 1 microsecond, and frame spacing can range from 50 nanoseconds to 150 microseconds.

The AWG laser system's 16 benefits do not end there. With so many electrons packed into the DTEM's 46 relatively tight electron pulses 40, electrons in the microscope column frequently collide with and repel one another, potentially degrading image resolution. For example, information encoded in the trajectories of individual electrons as they pass through the sample 20 (i.e., target) can be lost when those electrons later bounce off one another. The affected electrons reform their pattern in a different way on the imaging screen, causing stochastic blurring of the resulting image. This is a difficult problem to mitigate.

Electron-electron interactions can also disperse the electron pulse. The electron optics in the DTEM 46 of the system 10 partially compensate for this type of blurring. In addition, the AWG laser system 16 can temporally shape the pulses 38 to minimize these effects in the photocathode 36 and increase brightness. Temporally shaping each pulse 38 also provides a constant intensity during each pulse. If each pulse 38 has an intensity that is different, then the optimal lens currents for each pulse will also be different.

Electron repulsion effects essentially set the lower limit for the spatial resolution of previously developed DTEMs as currently designed. Fortunately, not all experiments require nanosecond time resolution. The AWG laser system 16 offers the ability to trade off spatial resolution and exposure time. Experiments designed to study somewhat slower processes, such as certain catalytic reactions and crystallization, can use longer pulses and thus exposure times. Because long pulses experience fewer electron interactions than short ones, they can generate more electrons to boost the signal and spatial resolution. Even the longest pulses produced by a DTEM are four orders of magnitude shorter in time than the exposure times of a conventional TEM.

Sample Drive Laser 18

The DTEM 46 has a highly precise, adjustable and powerful heating element,—an additional pulsed sample drive laser 18, for initiating the dynamic process to be probed, yielding temperatures and heating rates far beyond those offered by a standard TEM. The sample drive instrument (e.g., laser 18 in FIG. 1) is synchronized with the AWG laser system 16 to control the time that elapses between heating and the electron pulse arriving at the sample 20. The control system 12 and control software 14 also allow researchers to specify the conditions for initiating a material process. Other methods of initiating processes in the sample are also employed through electrically triggered sample holders, or external electronics connected to sample holders, that may deliver a voltage pulse, a current pulse, an electrically driven heat pulse, or an impulse delivered through a nanoindentation or microelectromechanical system.

Instead of heating an entire sample at once, when using a pulsed sample drive laser the DTEM 46 confines heating to an area less than 100 micrometers across, enabling users to isolate both fast and slow reactions. For instance, at high temperatures, many metals undergo phase transformations within picoseconds (10-12 seconds) to microseconds, while oxidation occurs more slowly. The gradual, uniform heating available in a conventional TEM cannot separate the two processes. With the DTEM's 46 specimen laser 18 and nanosecond acquisition rates, researchers can quickly heat a sample, capture transformations before the sample has time to oxidize, and compare those results to the properties of an unheated sample.

Deflector Subsystem 28

As shown further in FIGS. 2 and 3, the deflector subsystem 28 is an accurately timed, high-speed electrostatic deflector array in which four high-voltage switches (of switching subsystem 26) connected to customized deflectors plates 30*a*/30*b* and 30*c*/30*d*. Deflector plates 30*a*/30*b* are inserted into an upper pole piece 31*a* of a projector lens 31 above the sample, and deflector plates are inserted into a lower pole piece 31*b* of the projector lens 31. The deflector plates 30*a*-30*d* are thus positioned below (i.e., downstream of) the sample 20. The deflector plates 30*a*-30*d* are nearly parallel but slightly curved and flared at their lower ends order to maximize the deflection for a given applied voltage while minimizing image distortion. The deflector plates 30*a*-30*d* are inserted into the bottom of the projector lens 31 using an alignment system (not shown) consisting of four shaped ceramic pieces that ensure a tight fit and precise positioning. The distance between the plates can range from about 0.5 mm to about 10 mm depending on the desired operating voltage and maximum angle of deflection. Typical vertical and horizontal dimensions of each plate can range from about 1 cm to about 4 cm. The top-to-bottom curvature (i.e., along arrow A in FIG.

2) is very slight for optimum performance, with a radius of curvature ranging from about 10 cm to infinity (infinity corresponding to a flat plate). The deflector plates 30*a*/30*b* and 30*c*/30*d* deflect each image to a different part of the camera 32, thereby overcoming the camera's multi-second refresh rate. The current design creates nine frames with 512 by 512-pixel resolution, but other arrangements are possible.

As shown above, the electrostatic deflector subsystem 28 consists of the set of 4 plates 30*a*, 30*b*, 30*c* and 30*d* placed, in this implementation, within the lower part of the projector lens 31, being the last electromagnetic lens in a standard TEM. FIGS. 2 and 3, which are two orthogonal cross sections through the projector lens pole piece 31 (a pre-existing part of the transmission electron microscope) show the locations and approximate shapes of the four deflector plates 30*a*, 30*b*, 30*c* and 30*d*. Each plate 30*a*, 30*b*, 30*c* and 30*d* may independently carry a voltage ranging from −1600V to +1600V, allowing complete flexibility over the electron deflection in two dimensions. However, the deflector subsystem 28 is able to withstand applied voltages of at least about 2 kV without breakdown. The camera itself is roughly 50 cm below this set of deflectors, so that the electron beam can be directed to any part of the camera (i.e., CCD 32). The space between the deflector plates and the projector lens polepiece is partially filled with a ceramic mounting, alignment, and electrical connection system integrated with the deflector plates 30*a*, 30*b*, 30*c* and 30*d*. The deflector subsystem 28 can be inserted and removed while maintaining its alignment.

Other positions for the deflector subsystem 28, for example within an intermediate lens system, are also possible. The deflector subsystem 28 can direct each of the electron pulses to a different region on a large camera (i.e., CCD 32), thereby spatially separating the various images and diffraction patterns captured by each electron pulse 40. The image produced by the camera (or CCD 32) then consists of an array (typically 2×2, 3×3, 4×4, or 5×5) of images and diffraction patterns captured from different points in time. Images or diffraction patterns may also be streaked by switching the voltage on a deflector plate 30*a*-30*d* while an electron pulse is traveling through it, thus (especially in conjunction with a slit aperture that selects a narrow region in either real space or reciprocal space) providing time resolution of order 1 nanosecond or less. Because of the flexibility of the timing system, streak and fixed-frame operation may be freely intermixed in a single acquisition. The camera (e.g., CCD 32) itself does not need high time resolution; the time resolution of the system comes from the arbitrary pulse train and the fast switching of the deflector subsystem 28. However, future evolutions of this technology are envisioned which may use other emerging camera technologies such that hundreds of frames can be acquired.

Programmable Electronic Timing and Control System

Finally, the electronic control system 12, fully synchronized with the AWG laser system 10 (in one implementation, using digital outputs from the very same electronic unit that generates an analog pulse train), independently controls the voltage on each of the four deflector plates 30*a*, 30*b*, 30*c* and 30*d*. Unlike previous implementations, each plate 30*a*, 30*b*, 30*c* and 30*d* may be rapidly set and reset in an arbitrary sequence of positive, negative, and zero voltage settings. This control can be achieved through an array of digitally-controlled MOSFET switches in the switching subsystem 26 that connect the number of high voltage supplies being used, in this example the two high voltage supplies 22 and 24 (set, for example, to +800V and −800V), independently to each of the deflector plates 30*a*, 30*b*, 30*c* and 30*d*. Again, the number of high-voltage supplies used can vary, and in the example embodiment explained herein that number just happens to be four.

The cable lengths employed and the applied voltages to the deflector plates 30a-30d dictate the switching speed. Using current off-the-shelf components (e.g., made by Directed Energy, Inc.), this switching time is on the order of 100 nanoseconds or less, though it is expected that future upgrades may even further improve on this performance. Thus the system 10 can be set to direct any of the electron pulses 40 to any region of the CCD 32, provided the inter-frame time is long enough for the MOSFET switches to function. With each pair of plates 30a, 30b, 30c and 30d able to be set to five distinct potential differences (e.g. +1600V, +800V, 0V, −800V, −1600V), the resulting array can be as large as 5×5 with only two high-voltage power supplies and eight MOSFET switches. The control system 12 is programmed to avoid connecting the positive and negative voltage supplies to any single plate 30a, 30b, 30c and 30d simultaneously. The magnitude of the high voltage will be adjusted for different array sizes ranging from 2×2 to 5×5, while the centering of the entire array pattern is achieved using a magnetic deflector built into the projector lens system by the original manufacturer of the TEM. This description is only meant as an example of a general mode of operation, and other modes are possible. For example, a 4×4 array can be achieved with only four switches if two different voltage magnitudes are used. Also, electronic components other than conventional MOSFET switches, for example photoconductive switches, could also be used.

The control system 12 and the switching subsystem 26 use standard electronic components coupled with custom LabVIEW™-based software (i.e., control software 14) that enables precise control over the pulse shapes, coordinated switching, and miscellaneous timing integration for the entire system 10.

Additional Details of Control System 12

Figure 4A:
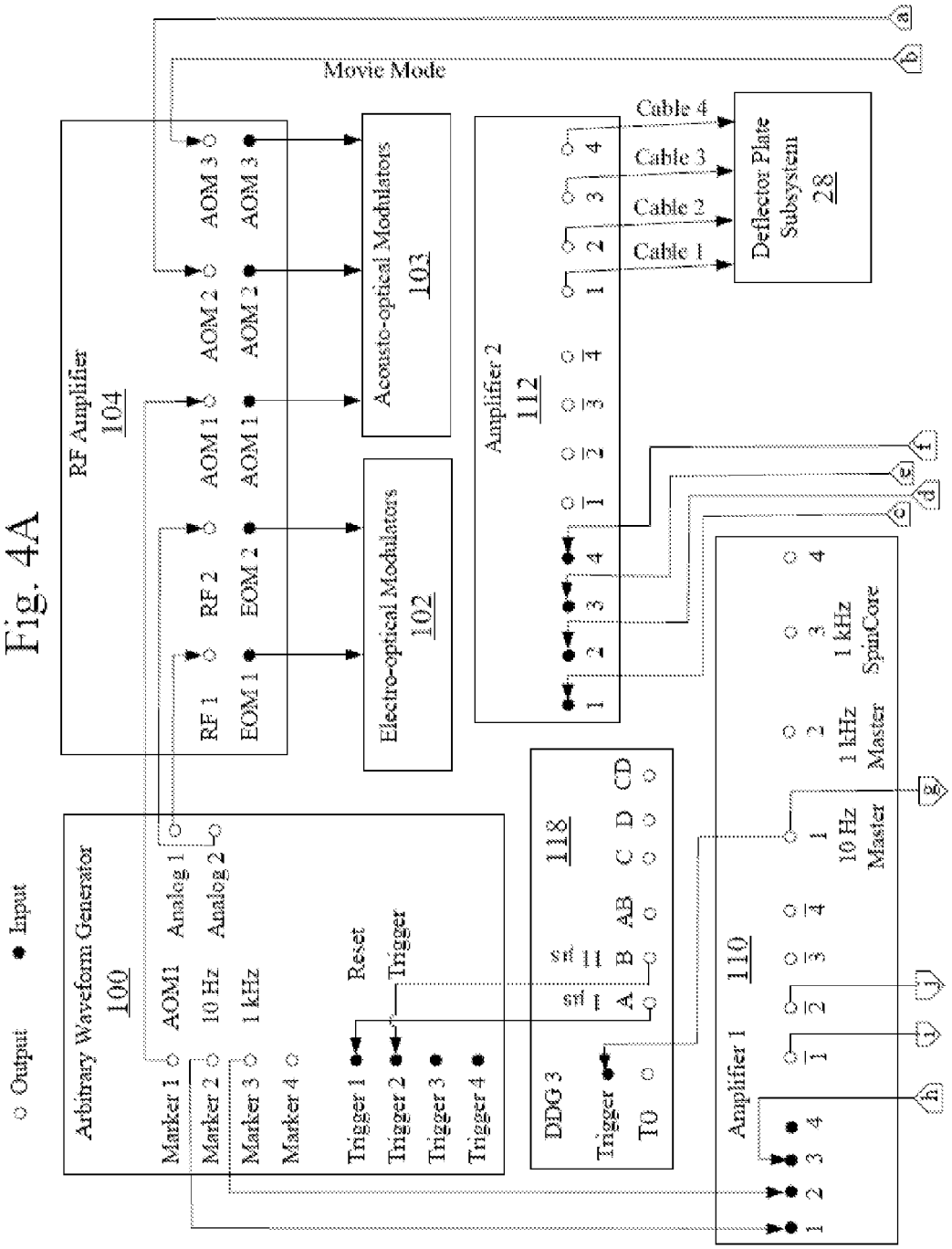
FIGS. 4A and 4B illustrate a more detailed block diagram of the electronics components of the AWG laser system that help to provide the programmable pulse durations and programmable inter-pulse spacings for the laser pulses.
Figure 4B:
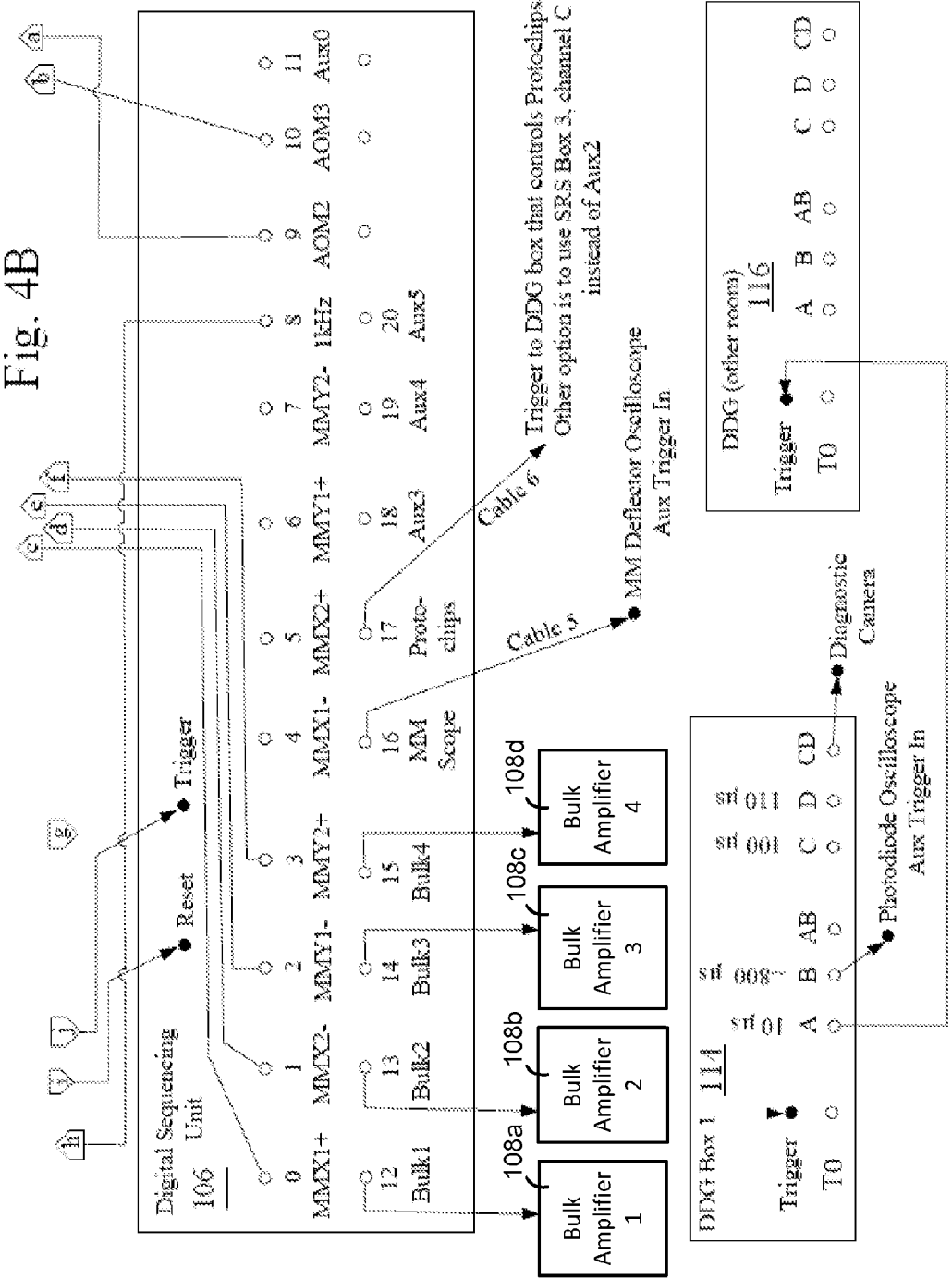

The control system 12 forms a highly important subsystem for producing the programmable pulse width control and programmable inter-pulse spacing that provide the system 10 with the pulse control capabilities that have been heretofore unavailable with prior developed laser pulse control systems. Referring to FIGS. 4A and 4B, the control system communicates with an arbitrary waveform generator (AWG) 100, which in one form may comprise an AWG available from Agilent Technologies Inc. of Santa Clara, Calif. The AWG 100 provides the timing master signals for both 10 Hz and the 1 kHz timing subsystems while also providing analog waveforms for a pair of Mach-Zender electro-optical modulators (EOMs) 102 and a digital waveform for a first acousto-optical modulator (AOM1) of a plurality of AOMs 103.

A digital sequencing unit 106 is triggered by the clock signals from the AWG 100 unit and provides 21 digital outputs with 2 ns granularity and ±1 ns triggering jitter. This may be established by comparing a 1 kHz clock output by the digital sequencing unit 106 unit with the 1 kHz master clock output by the AWG 100. In one implementation the digital sequencing unit 106 comprises a 500 MHz PulseBlaster ESR-Pro SP18A available from SpinCore Technologies, Inc., of Gainesville, Fla. The output sequence from the digital sequencing unit 106 is fully arbitrarily programmable on each of its 21 outputs. This is a significant advance over previously developed systems. This feature enables a completely user programmed sequence of pulses, where each pulse has a user programmed duration and is separated by user programmed inter-pulse spacings. As a result, the images obtained by the system 10 can be highly tailored through the user selection (i.e., programming) of different pulse durations and, if desired, changing (i.e., programming) inter-pulse spacings between pulses, to best meet the needs of a specific sample event.

The digital sequencing unit 106 is unit is responsible for turning on and off the voltages applied to the deflector plates 30a-30d, and for turning on and off second and third AOMs (i.e., AOMs 2 and 3) of the group of AOMs 103, and also for generating the triggers for a plurality of bulk amplifiers 108a-108d, and an array of auxiliary equipment including sample drives and diagnostics. The four electrostatic deflector plates 30a-30d are driven by the high-voltage MOSFET switches of the MOSFET switching subsystem 26, which is in turn connected to the +800V supply 22 and the −800 V supply 24. Each deflector plate 30a-30d is independently turned on and off using its own digital control line "1"-"4" from amplifier 112. Voltages of anywhere from 0V to −100V to −1600V, as well as +100V to +1600V, may be applied independently to each of the deflector plates 30a-30d.

The control system 12 further incorporates an RF amplifier unit 108 that takes the low-voltage analog outputs from the AWG 100 and amplifies them to the ~10V range needed to drive the EOMs 102. In addition, three amplifiers supply radio-frequency drive signals to the AOMs 103, turning them on and off under control of the TTL digital signals coming from the AWG 100 and the digital sequencing unit 106. This unit 106 enables the AWG 100 and the digital sequencing unit 106 unit to control all of the EOMs 102 and the AOMs 103 independently and with arbitrary temporal sequences.

After the series of EOM modulators 102 and AOM modulators 103, as well as fiber amplifiers, the AWG laser system 16 has the programmed sequence of pulse durations and inter-pulse spacings, as well as a completely user-controlled pattern of intensity modulation within each pulse, but the energy-per-pulse is far too low for the ultimate application. To amplify the energy-per-pulse to sufficient levels, the laser outputs are passed in series through the bulk amplifiers "Bulk1", "Bulk2", "Bulk 3" and "Bulk 4" 108a-108d, which comprise a series of four diode-pumped Nd-YAG bulk amplifiers. The bulk amplifiers 108a-108d increase the power of the AWG laser system 16 while retaining essentially the same temporal profile for the laser pulses 38 being generated. The bulk amplifiers 108a-108d do cause some distortions of the exact pulse shapes, but the fully arbitrary nature of the AWG electronics can compensate for these effects, thus producing the desired final pulse shapes, for example square-wave pulses of uniform amplitude but varying frequencies and durations. Interspersed with the bulk amplifiers 108a-108d may be alignment mirrors, isolators, spatial filters (in vacuum for the higher-powered later stages, so as to avoid electrical breakdown in air), and diagnostics including cameras, power meters, and photodiodes.

The control system 12 as shown in FIGS. 4A and 4B further includes first and second amplifier units 110 and 112, which each comprise 4-channel inverting+non-inverting TTL amplifiers. The amplifier units 110 and 112 are used to buffer the digital outputs from the AWG 100 and Movie Mode and 1 kHz clock channels of the digital sequencing unit 106. This provides low-output-impedance TTL signals for driving long 50 ohm cables without loading down the digital outputs of the AWG 100 and digital sequencing unit 106. Further, amplifier unit 110 produces the logic-inverted trigger pulses expected by the digital sequencing unit's 106 "Trigger" and "Reset" inputs. The AWG's 100 two clock outputs (i.e., 10 Hz and 1 kHz) are deliberately set up with a 10 µs lag between them so that every 100 ms the digital sequencing unit 106 is reset to the start of a sequence and, every 1 ms, the digital sequencing unit receives a trigger to start a new pulse sequence. The digital sequencing unit 106 is programmed so that the first pulse sequence is the user-specified (i.e., programmed) sequence, complete with bulk amplifier triggers, movie mode switches, and everything else used by the 10 Hz subsystem, and the next 99 pulses are standby pulses in which only the 1 kHz fiber laser system (i.e. the laser components incorporating the EOM 102 and AOM 103 components) is triggered.

The control system 12 also includes a set of digital delay generators ("DDG") 114, 116 and 118. These may be DG535 delay generators available from Stanford Research Systems of Sunnyvale, Calif. The DDGs 114-118 deployed throughout the system 10 provide simple but precise distribution of triggers to auxiliary equipment not directly controlled by the digital sequencing unit 106. The DDGs 114-118 can operate autonomously and can be configured to operate as the timing master in place of the AWG 100 (as is enabled by the connections from DDG 118 (i.e., DDG 3) to the Reset and Trigger inputs of the AWG 100). This operating mode allows very long lead times for sample drive events that need to occur more than one millisecond before the sample 20 is probed with the electron pulse train 40. The DDGs 114-118 can be easily reconfigured on the fly without interruption of the AWG laser system 16, but they are far less programmable than the digital sequencing unit 106 or the AWG 100; thus they are useful adjunct units for controlling semi-stand-alone subsystems but do not necessarily have the flexibility to control the deflectors plates 30a-30d, the AOMs 103, or other units that need complex and arbitrary sequencing. Additional auxiliary DDGs that extend the core system, for example triggered by "Cable 6" emerging from the digital sequencing unit 106 as well as the outputs of DDG 116 (unused in the drawing), as needed for specialized experiments.

The entire system 10 is controlled through the control software 14 running in the LabVIEW® commercial software environment. The control software 14 needs to provide flexible control over all arbitrary waveform parameters while automatically updating the windows for the AOMs 103 so that the laser pulse is allowed through each amplifier stage at the appropriate times while the stages are isolated from each other to minimize amplification of low-level noise at all other times. The control software 14 accounts for all time lags involving cabling, electronics, photon propagation, electron propagation, etc., so that once these lags are calibrated, their effects are invisible to the user. The control software 14 provides the user with an interface such that the time of arrival of the first pulse at each element of the system 10 is defined to be time-zero for that element, even though the actual arrival times at different components will vary by tens of nanoseconds. The control software 14 also allows the sequencing of completely arbitrary patterns of movie-mode deflector plate 30a-30d settings as well as the specification of numerous external output triggers for the four bulk amplifiers 108a-108d as well as oscilloscopes, shutter enabling units, cameras, sample drive lasers, etc. The control software 14 keeps track of the 1 kHz and 10 Hz timing systems, such that the 1 kHz subsystem is practically invisible to the user and simply runs in the background without user intervention. The control software 14 may also include an algorithmic feedback optimization system such that the desired pulse shape is compared to the measured pulse shape at a diagnostic photodiode (again, automatically compensating for time lags) and the difference is minimized with respect to the large and variable number of parameters defining the shape of the analog output pulse. The control software 14 also has the flexibility to accommodate significant changes in the hardware and different experimental hardware configurations.

General Needs of Timing/Control System

The control system 12 needs to provide all of the timing signals for every component in the system 10. The fiber front end, i.e. the laser system subassembly that includes the EOM 102 and AOM 103 subunits but not the bulk amplifiers 108a-108d and associated hardware) needs to fire "standby" pulses at 1 kHz in order to maintain stability without damage to the system 10. The bulk amplifiers 108a-108d cannot fire at 1 kHz, and are instead operated at 10 Hz, thus one pulse train in 100 is amplified by the bulk amplifiers 108a-108d while the remainder of the pulse trains remain at very low power and have no further effect on the system 10. The control system 12 needs to control both the 1 kHz and the 10 Hz subsystems while providing all of the timing signals needed for experiments, including signals that trigger the instrument 18 (i.e., sample drive laser) or other electrical system that initiates the process of interest in the sample 20. The system 12 is required to operate with a total timing jitter on the order of ±1 ns or less.

Operation

In typical operation the sample drive laser 18, the AWG laser system 16, and the deflector subsystem 28 may follow a pre-defined sequence to drive the sample 20 and acquire images or diffraction patterns at user-specified points in time before, during, and after the sample drive event. The image from the CCD 32 is then read out and digitally segmented into a series of typically 4, 9, 16, or 25 frames (depending on the settings applied). In another operating mode a camera (e.g., CCD 32) with a fast read-out speed (typically milliseconds for a modern fast TEM camera) is synchronized with the AWG laser system 16 and the deflector subsystem 28. In this manner acquisition may run continuously, with as many as 25 frames acquired per camera read-out time, thus producing movies with frame rates increased by a factor of up to 25 relative to a standard system. In yet another operating mode the camera is a fast-framing camera capable of locally storing multiple images with typically microsecond-scale frame switching times. This operating mode would enable hundreds of individual exposures to be recorded in a matter of microseconds. Such fast-framing cameras are typically able to cycle through the set of locally-stored images, with acquisition halted by an external trigger, at which time the camera can report the last (for example) 100 frames so acquired. This would be especially useful for processes like dislocation injection during nano-indentation, the exact onset of which is impossible to predict but which may be detected some microseconds or milliseconds after the fact by monitoring (for example) the force-displacement curves.

The operation of the control system 12, as shown in FIGS. 4A and 4B, is as follows. The AWG 100 is used to provide a continuous-wave (CW) low-power seed laser. This is followed by a first AOM of the AOMs 103 that chops the laser into temporal pulses for later modulation and amplification. The AOMs 103 act as binary switches for the AWG 100 laser system, either allowing or disallowing the beam of the laser to pass at any given time, with an extremely high contrast ratio between the on and off states. After a first one of the AOMs 103, the pulse or pulse series enters the EOMs 102, which impart an arbitrary analog waveform onto the laser with a resolution of about 0.8 ns. This is followed by a fiber laser amplifier (not shown), then another modulator (i.e., a second one of the AOMs 104), then another laser amplifier (not shown) and another one of the AOM modulators (i.e., AOM3 of the AOMs 103). AOMs 2 and 3 of the AOMs 103 open and close in a sequence identical to that of AOM1 except for user-adjustable time lags to account for cable delay, electronics delays, photon propagation, and the finite switching speed of the AOMs. Their purpose is to eliminate low-intensity noise between pulses that would otherwise, if present, be amplified by later stages.

Example Embodiment

In one example embodiment as shown in FIG. 1, the lens used in the DTEM 46 may be of a type having: (1) a fixed aperture (lens stack 42) arranged downstream of the laser driven photocathode 36 so that the electron pulses 40 pass through the fixed aperture, and where the fixed aperture having a radius less than a RMS radius of the electron pulses; (2) a condenser lens system (lens stack 44) arranged downstream of the fixed aperture to focus the electron pulses 40 from the fixed aperture to the sample 20; and (3) an upstream condenser lens (not shown in the drawing) arranged between the laser driven photocathode 36 and the fixed aperture to focus substantially all electrons of the electron pulses 40 from the photocathode 36 through the fixed aperture to the condenser lens system so that the electron pulses 40 pass through the condenser lens system 44 with substantially no aberrations.

The inclusion of the upstream condenser lens arranged in this way enables higher currents (essentially the full current of the source, e.g. micro-amp/amp range, instead of picoamp or nanoamp) to be transferred to the entrance of the condenser lens system, and enables high information data rates and throughput, which is particularly important for enabling the production of time-resolved image data using single shot electron beam pulses. Further, the design of the system 10 to have "substantially no aberrations" means that the RMS brightness (a measure of beam quality that combines current, coherence, and focusability into a single quantity) is not degraded; the RMS brightness reaching the target (e.g. sample 20) is substantially the same as the RMS brightness produced by the photocathode 36. A weak lens is of a type having a focal length "f" greater than about 100 mm (e.g. f~150-200 mm) for typical operating parameters of the DTEM 46. And a large bore is of a type greater than about 40 mm (e.g. 48 mm).

Because the upstream condenser lens is arranged to focus substantially all electrons of the electron beam pulses 40 from the photocathode 36 through the fixed aperture to the condenser lens system, the fixed aperture does not normally function as a beam delimiter (common in conventional EM systems) which would otherwise reduce the beam current. In this manner, the upstream condenser operates to preserve virtually all the beam current that is generated at the source for transmission to the sample 20.

The upstream condenser lens may be an electrostatic or electromagnetic lens, which can be either static or dynamic, with controls for adjusting the focal length and crossover point of the beam. The crossover point is near the first condenser lens (e.g. the C1 lens of a typical TEM design) of the condenser lens system and may be suitably adjusted above the entrance or below the exit of the first condenser lens.

Referring briefly to FIG. 5, another embodiment 200 of the deflector subsystem is shown which involves a larger plurality of deflector plates, in this example eight such deflector plates 202-216 arranged generally circumferentially about an axial center (indicated by arrow A) of the projector lens 31 or within the second lens stack 44. The deflector plates 202-216 in this example have a slightly curved shape, although perfectly flat plates could be also be used. The dimensions indicated on FIG. 5 are meant to convey merely one example of particular dimensions that the plates 202-216 may have. It will also be appreciated that a corresponding number of output channels of the second amplifier 112 or of an additional similar amplifier should be available so that a separate output channel is available for each of the deflectors 202-216. FIG. 6 shows another example of an embodiment 300 which uses 12 independently controlled deflector plates 302-324 arranged in a polar fashion around an axial center (line A) of the projector lens 31. The use of 8 or 12 independent plates, each with its own voltage setting, allows deflection in an arbitrary direction in two dimensions, with minimal distortion or other aberrations, so the that electric field encountered by any given electron very closely approximates a uniform transverse field.

Although the description above contains many details and specifics, these should not be construed as limiting the scope of the invention or of what may be claimed, but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:
1. An electron microscope comprising:
a laser-driven photocathode;
an arbitrary waveform generation (AWG) laser system for producing a train of temporally-shaped laser pulses each having a programmable pulse duration, and arranged to direct the laser pulses to the laser-driven photocathode for producing a train of electron pulses;

a first lens stack arranged to focus the train of electron pulses to a sample; a second lens stack producing a magnified image or diffraction pattern of the sample onto an image sensor;

a deflector subsystem having a plurality of electrostatic deflector plates arranged downstream of the sample and upstream of the image sensor, the deflector plates arranged offset from, and circumscribing, an axis along which the train of electron pulses travel; and a control system including a digital sequencing component in communication with both the AWG laser system and the deflector subsystem, the control system communicating with a plurality of switching components and synchronized with the AWG laser system for rapidly and reversibly switching voltage signals applied to each one of the deflector plates to independently control excitation of each one of the deflector plates to sync operation of the deflector subsystem with the train of laser pulses, to direct each said electron pulse to a different portion of the image sensor to capture a high-speed sequence of images or diffraction patterns of the sample, and to provide each said electron pulse with an independently set and programmable pulse duration, and to set inter-pulse spacings between sequentially generated ones of the electron pulses that are independently controlled by the control system and programmable.

2. The electron microscope of claim 1, wherein the control system controls the AWG laser so that a frame shift occurs during at least one of the temporally shaped laser pulses to create a streak image on the image sensor.

3. The electron microscope of claim 1, wherein the control system enables multiple images or diffraction patterns to be acquired on at least one of a nanosecond scale or a microsecond scale before, during and after a single sample drive event.

4. The electron microscope of claim 1, wherein a duration of one of the electron pulses ranges from about 5 nanoseconds to about 250 microseconds.

5. The electron microscope of claim 1, wherein the control system controls the AWG laser system and the deflector subsystem to produce interframe times as low as 10 nanoseconds.

6. The electron microscope of claim 1, wherein the control system controls the AWG laser system to produce the temporally shaped laser pulses as ultraviolet (UV) laser pulses, which each have a temporally square shape.

7. The electron microscope of claim 1, wherein the AWG laser system includes:
a digital-to-analog arbitrary signal generator;
a continuous wave (CW) seed laser;
a plurality of laser amplifiers including both fiber-based and free space solid-state amplifiers;
electro-acoustic and acousto-optic modulators;
a refractive optic;
a plurality of lens relays; and
a plurality of pinhole spatial filters.

8. The electron microscope of claim 1, wherein the electron microscope produces the train of optical pulses such that each of the pulses has a total energy per pulse of at least about 100 millijoule.

9. The electron microscope of claim 1, wherein the train of pulses creates a mixture of multiple microsecond exposure images and nanosecond exposure images on the image sensor.

10. The electron microscope of claim 1, wherein the control system controls the application of a voltage ranging between −1600V to +1600V to each said plate of the deflector subsystem to deflect one or more of the train of electron pulses in two dimensions to selected regions of the image sensor.

11. The electron microscope of claim 10, wherein each one of the electron pulses of the train of electron pulses is deflected by the deflector subsystem to produce at least one of a:
two by two array of images or diffraction patterns on the image sensor;
three by three array of images or diffraction patterns on the image sensor;
four by four array of images or diffraction patterns on the image sensor; and
five by five array of images or diffraction patterns on the image sensor.

12. The electron microscope of claim 10, wherein the switching element comprises an array of digitally controlled metal oxide silicon field effect transistors (MOSFETs).

13. An electron microscope comprising:
a laser-driven photocathode;
an arbitrary waveform generation (AWG) laser system for producing a train of temporally-shaped laser pulses, each having a programmable pulse duration and being separated by programmable inter-pulse spacings, and arranged to direct the laser pulses to the laser-driven photocathode for producing a train of electron pulses;
a first lens stack arranged to focus the train of electron pulses to a sample;
a second lens stack producing a magnified image or diffraction pattern of the sample;
an image sensor;
a control system for providing control inputs to the AWG laser system and for controlling the programmable pulse durations and inter-pulse spacings between the train of temporally-shaped laser pulses;
a deflector subsystem controlled by the control system, the deflector subsystem having a plurality of spaced apart electrostatic deflector plates arranged downstream of the sample and upstream of the image sensor;
a voltage supply system for supplying high voltage signals to the deflector plates, and being controlled by the control system and synchronized with the AWG laser system;
a plurality of switching elements controlled by the control system for generating switching signals to independently control an application of the high voltage signals to each one of the deflector plates; and
the control system including a digital sequencing component configured to independently and rapidly reversibly switch the high voltage signals applied to each of the deflector plates in synchronization with the train of laser pulses to direct each said electron pulse to a different portion of the image sensor to capture a high-speed sequence of images or diffraction patterns of the sample.

14. The electron microscope of claim 13, wherein the train of temporally shaped laser pulses produced by the AWG laser system comprises laser pulses having non-uniform inter-pulse spacings between sequential ones of the laser pulses.

15. The electron microscope of claim 13, wherein the high voltage signals comprise voltages between −1600 to +1600, which are selectively applied to the deflector plates.

16. The electron microscope of claim 15, wherein the deflector plates comprise first and second pairs of plates, with said first pair of plates being arranged parallel to each other, and said second pair of plates being arranged parallel to each other and perpendicular to said first pair of plates.

17. The electron microscope of claim 13, wherein the control system controls the AWG laser system so that a frame shift occurs during at least one of the temporally shaped laser pulses to create a streak image on the image sensor.

18. The electron microscope of claim 13, wherein each said laser pulse of the train of laser pulses comprises a temporally square shape.

19. A method for performing dynamic transmission electron microscopy (DTEM) comprising:
- providing a laser-driven photocathode;
- using an arbitrary waveform generation (AWG) laser system to generate a train of temporally-shaped laser pulses of programmable pulse durations and programmable inter-pulse spacings, the temporally-shaped laser pulses being directed at the laser-driven photocathode to impinge the laser-driven photocathode and cause a train of electron pulses to be emitted from the laser-driven photocathode;
- focusing the train of electron pulses to a sample;
- using an image sensor to receive the train of electron pulses downstream of the sample, and after the train of electron pulses has impinged the sample;
- using a deflector subsystem having a plurality of deflector plates arranged downstream of the sample but upstream of the image sensor, to controllably deflect the train of electron pulses onto selected subportions of the image sensor, and
- using a control system having a digital sequencer to communicate with the AWG laser system, the deflector subsystem and a plurality of switching components to synchronize the AWG laser system and the deflector subsystem, to:
  - rapidly and reversibly switch voltage signals applied to each one of the deflector plates to independently control excitation of each one of the deflector plates to synchronize operation of the deflector subsystem with the train of laser pulses, to thus direct each said electron pulse to a different portion of the image sensor to capture a high-speed sequence of images or diffraction patterns of the sample;
  - to provide each said electron pulse with an independently set and programmable pulse duration controlled by the control system; and
  - to provide inter-pulse spacings between sequentially generated ones of the electron pulses that are variable and programmable.

20. The method of claim 19, wherein the control system controls the AWG laser system and the deflector plate voltages to produce temporally square shaped laser pulses from the AWG laser system.

* * * * *